United States Patent
Tatsuoka et al.

[11] Patent Number: 5,729,048
[45] Date of Patent: Mar. 17, 1998

[54] CMOS IC DEVICE SUPPRESSING SPIKE NOISE

[75] Inventors: Masato Tatsuoka; Tomio Sato, both of Kawasaki, Japan

[73] Assignee: Fujitsu Limited, Kawasaki, Japan

[21] Appl. No.: 759,642

[22] Filed: Dec. 5, 1996

Related U.S. Application Data

[63] Continuation of Ser. No. 265,218, Jun. 24, 1994, abandoned.

[30] Foreign Application Priority Data

Sep. 17, 1993 [JP] Japan ..................... 5-231945

[51] Int. Cl.$^6$ .............................................. H01L 29/417
[52] U.S. Cl. ...................... 257/665; 257/208; 257/773; 257/775
[58] Field of Search ...................... 257/369, 665, 257/773, 775, 923, 664, 204, 207, 208, 211

[56] References Cited

U.S. PATENT DOCUMENTS 5,101,261  3/1992  Maeda .
5,365,091  11/1994  Yamagishi ..................... 257/208

FOREIGN PATENT DOCUMENTS

| 0 223 698 | 11/1986 | European Pat. Off. . |
| 0 499 063 | 1/1992 | European Pat. Off. . |
| 59-168650 | 9/1984 | Japan . |
| 60-21543 | 2/1985 | Japan . |
| 0002122 | 1/1990 | Japan ..................... 257/207 |
| 2-2122 | 1/1990 | Japan . |
| 3-209851 | 9/1991 | Japan . |

*Primary Examiner*—Wael Fahmy
*Assistant Examiner*—David B. Hardy
*Attorney, Agent, or Firm*—Nikaido, Marmelstein, Murray & Oram LLP

[57] ABSTRACT

A CMOS IC device operating at a frequency of 300 MHz or higher includes a power supply wiring for interconnecting one of circuit elements and a power supply pad, and a phase-shifting split wiring connected to the power supply wiring and not directly connected to any circuit elements, only for producing a noise phase difference between noises on the power supply wiring and the phase-shifting split wiring. A signal entering from the phase-shifting split wiring has a phase different from the phase of a signal transmitted on the power supply wiring to thereby reduce spike noises.

18 Claims, 17 Drawing Sheets

$$\triangle \phi = \phi 2 - \phi 1$$

$$\triangle \phi = 2 \phi 3$$

CMOS IC DEVICE SUPPRESSING SPIKE NOISE

This is a continuation of application of application Ser. No. 08/765,218, filed Jun. 24, 1994, now abandoned.

BACKGROUND OF THE INVENTION a) Field of the Invention

The present invention relates to a CMOS IC device, and more particularly to a CMOS IC device with noise cancellation.

b) Description of the Related Art

A CMOS circuit is featured in low power dissipation in which substantial current is dissipated only in a very short period while circuit elements are switched. Low power dissipation has been desired as the integration of semiconductor devices has become high, which makes CMOS IC devices more important. However, spike current flows in CMOS IC devices so that spike noises are likely to be generated on power supply wirings.

To satisfy the requirements of a high speed circuit operation, techniques of high speed and high frequency operations of CMOS circuits have advanced. A power supply voltage has been lowered. In CMOS circuits operating at a high frequency and at a low voltage, if spike noises generated by the switching of circuit elements change a voltage on a power supply wiring, noises are generated at other circuit portions. Spike noises superposed on a power supply wiring greatly limit the circuit function.

One approach of alleviating the influence of switching noises on other circuit elements is to widen a power supply wiring. If the potential of a power supply wiring is pinned to a power supply voltage, the influence of switching noises can be reduced. There is a limit, however, in widening a power supply wiring because of the requirements of high integration. Other conventional proposals for preventing noises from entering other circuit elements via a power supply wiring are to form a number of pads, to form slits in parallel with a power supply wiring, or to form a power supply wiring in a lattice shape.

These countermeasures intend to reduce switching noises themselves by increasing the effective current capacity of a power supply wiring, and/or to alleviate the influence of noises by increasing the resistance of a path from a noise source to a connection node of a power supply wiring.

These conventional approaches of suppressing noises on power supply wirings narrow a usable range of a power supply potential (lowering a high level potential and raising a low level potential) so that an operating margin of a CMOS IC device is narrowed and its operating speed is lowered.

Conventional approaches of suppressing noises on power supply wirings have taken into consideration wiring resistance (R) components and capacitance (C) components, or time constants. It has been found that the approaches relying upon this technique have various restrictions. Restrictions are severe particularly at an operating frequency of 250 MHz or higher, for example in a frequency range of 250–300 MHz.

SUMMARY OF THE INVENTION

It is an object of the present invention to provide a CMOS IC device operating at a frequency of 300 MHz or higher and having novel countermeasures for reducing noises on power supply wirings.

According to one aspect of the present invention, there is provided a CMOS IC device operating at a frequency of 300 MHz or higher and having a power supply wiring connecting a power source to a circuit element and a phase-shifting by-pass or split wiring connected only to the power supply wiring for producing a phase difference between noises on the power supply wiring and on the split wiring.

At the operating frequency of 250 MHz or higher, the inductance (L) components and capacitance (C) components of a circuit play an important role.

The phase-shifting by-pass for producing a phase difference connected to a power supply wiring, which interconnects a circuit element and a power source, adds noise components having different phases to the noise components on the power supply wiring. Noise signals having different phases are cancelled so that noises can be reduced.

Noises on power supply wirings of a CMOS IC device operating at a frequency of 250 MHz or higher can thus be reduced by connecting a phase-shifting by-pass or split wiring to the power supply wiring for changing noise signal phases. If a plurality of split wirings are formed to change the phases of a plurality of noise signal waveforms, noises on a power supply wiring can be efficiently reduced.

DETAILED DESCRIPTION OF THE PREFERRED EMBODIMENTS

Figure 3A:
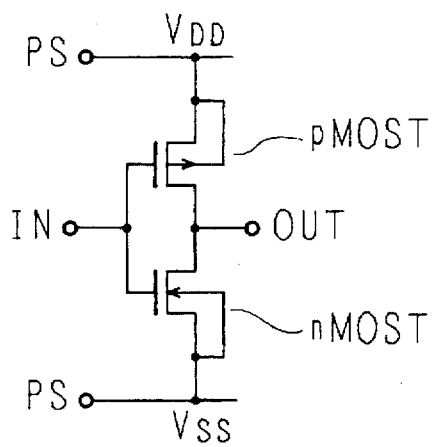
FIGS. 3A, 3B, and 3C are a circuit diagram of a CMOS inverter, a plan view of a wiring, and a cross sectional view of the CMOS Inverter.

Prior to the description of embodiments of the present invention, a CMOS circuit will be briefly explained. FIG. 3A is a circuit diagram of an inverter of a CMOS structure. A p-channel MOS transistor (p-MOST) and an n-channel MOS transistor (n-MOST) are serially connected between power supply wirings $V_{DD}$ and $V_{SS}$, which are connected to power supply pads PS.

The gate electrodes of two MOSTs are connected in common to an input terminal IN. The interconnection between two MOSTs is connected to an output terminal OUT.

Figure 3B:
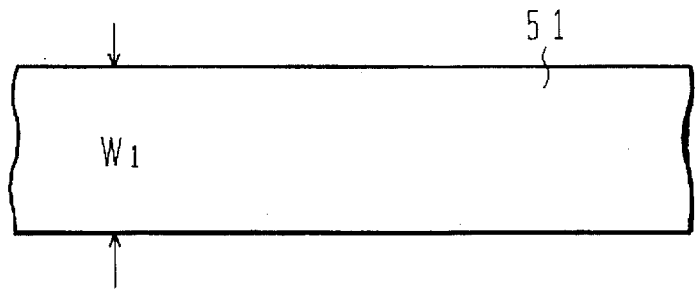

FIG. 3B is a plan view of a power supply wiring $V_{DD}$ connecting p-MOST to a power supply pad or another power supply wiring $V_{SS}$ connecting n-MOST to another power source pad. This wiring 51 has a thickness of t and a width of $W_1$. To increase the conductance of the wiring 51, the cross sectional area of the wiring represented by a product of the thickness t and width W1 is increased in a general case.

Figure 3C:
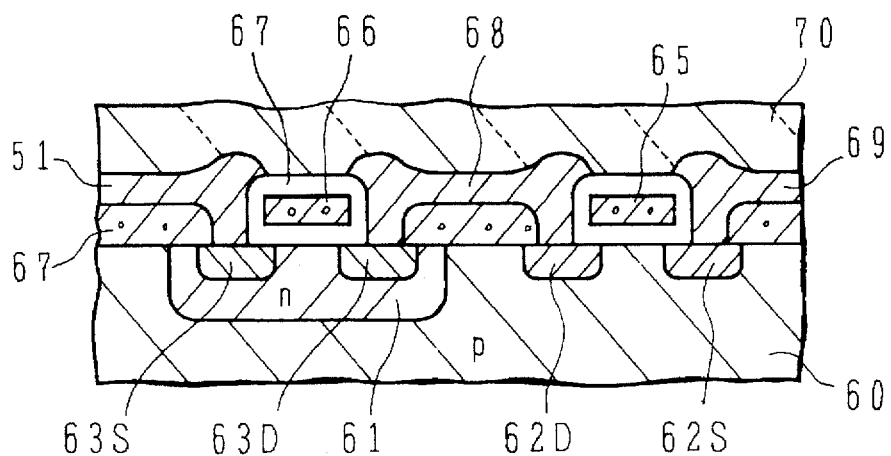

FIG. 3C is a cross sectional view of a CMOS circuit. An n-type well 61 is formed in a p-type silicon substrate 60. N-type source/drain regions 62S and 62D are formed in the p-type region of the substrate 60, and p-type source/drain regions 63S and 63D are formed in the n-type well 61. Polycrystalline silicon gate electrodes 65 and 66 are formed above the channels between the source and drain, with gate oxide films being interposed therebetween. The electrodes 51, 68 and 69 are connected to the source/drain regions via openings formed in an insulating film 67. Another insulating film 70 is formed on these electrodes. This CMOS circuit structure is well known. Other known structures may also be employed.

Referring to FIG. 3A, if the potential at the input terminal IN is high, n-MOST turns on and p-MOST turns off so that the potential at the output terminal OUT takes a low level. Conversely, if the potential at the input terminal IN is low, n-MOST turns off and p-MOST turns on so that the potential at the output terminal OUT takes a high level. Therefore, a serial connection of n-MOST and p-MOST constitute an inverter.

In such a CMOS inverter, one of MOSTs turns off in a steady state. As a result, current does not flow or flows scarcely, consuming a very small power.

Current flows in a CMOS inverter only when both MOSTs turn on transiently while an input signal potential changes.

At the instant when both MOSTs turn on, thorough current flows in the inverter so that current flows through the power supply wirings, generating spike noises because of a voltage drop by resistance components, or other factors.

FIG. 3B shows a conventional CMOS circuit wiring. $V_{DD}$ and $V_{SS}$ wirings are both formed by a conductive wiring layer 51 having a fixed width as shown in FIG. 3B. In order to avoid a voltage drop by a transient current, the cross sectional area of the power supply wiring layer 51 is made sufficiently large to lower the resistance sufficiently.

However, a large cross sectional area of the conductive wiring layer 51 increases greatly a ratio of the wiring area to the other area occupied by other elements of a semiconductor CMOS IC device.

To suppress noises on a power supply wiring of a CMOS IC device operating at a frequency of 300 MHz or higher, the present inventor proposes to connect a wiring or wirings having different phase shift or phase change to the power supply wiring so as to add potential waveform having different phase to the noise on the power supply wiring.

Noises are suppressed not only from the viewpoint of wiring capacitance and resistance but also from the viewpoint of wiring inductance discernible at a high speed operation. Noises on power supply ground wirings $V_{SS}$ and on high potential wirings $V_{DD}$ are generated by the current flowing in a noise source such as an inverter. Such noises are generated more as the clock frequency rises higher. A noise margin reduces in a low voltage operation so that the influence of noises cannot be neglected.

With a scale-down of an IC, although the size of a semiconductor element becomes small and integration is improved, noise sources are concentrated. Nearby wirings are coupled by a mutual inductance so that noises become a serious problem. If a circuit is designed without thickening a power supply wiring, inductance in addition to wiring capacitance and resistance becomes discernible, thereby increasing noises.

A method of suppressing noises from the viewpoint of wiring capacitance (C), resistance (R), and inductance (L) without thickening a power supply wiring will be described below.

A voltage at an optional point x on a single wiring having R, L, and C of an equivalent circuit is represented by the following equation:

$$V(x) = K_1 exp[-\alpha x] * exp[-j\beta x] \quad \ldots (1)$$

where $\alpha$ is an attenuation constant, $\beta$ is a phase constant, and $K_1$ represents a voltage at x=0. An instantaneous value at an optional point x is given by:

$$\begin{aligned}V(x,t) &= Im[(2)^{1/2}K_1 exp[-\alpha x] * sin(\omega t - \beta x)] \\ &= (2)^{1/2}K_1 exp[-\alpha x] * sin(\omega t - \beta x)\end{aligned} \quad (2)$$

where $\alpha$ and $\beta$ are:
$$\alpha = [RG - \omega^2 LC + \{(R^2 + \omega^2 L^2) * (G^2 + \omega^2 C^2)\}^{1/2}/2]^{1/2}$$
$$\beta = [-RG - \omega^2 LC + \{(R^2 + \omega^2 L^2) * (G^2 + \omega^2 C^2)\}^{1/2}/2]^{1/2}$$

Figure 1A:
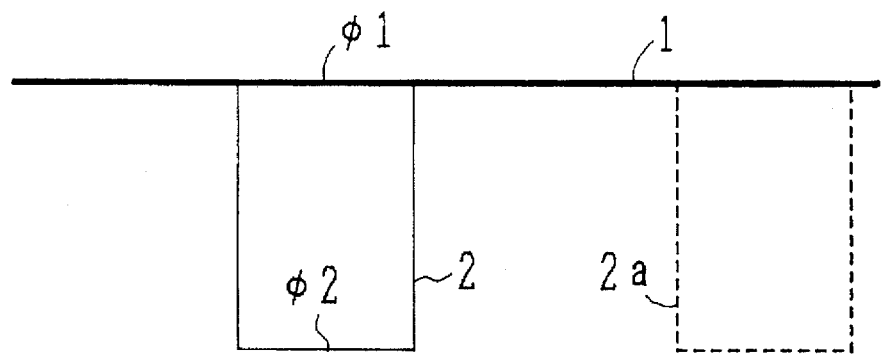
FIGS. 1A and 1B are schematic diagrams showing the fundamental structures of power supply wirings according to embodiments of the present invention.
Figure 1B:
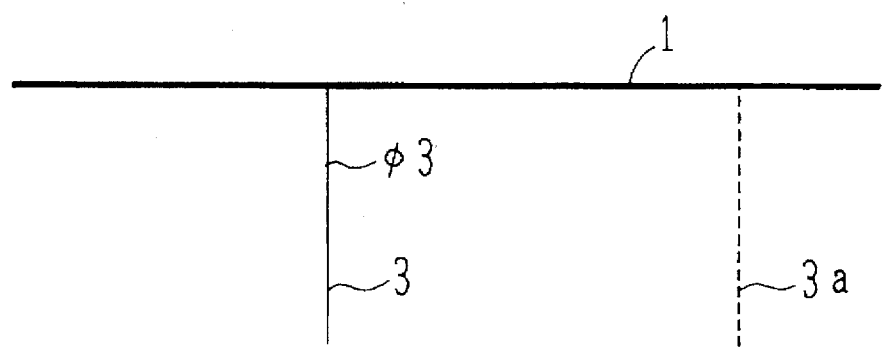

FIGS. 1A and 1B show the fundamental structures of power supply wirings according to embodiments of the present invention. FIG. 1A shows an example of a loop-forming split wiring whose two ends are connected to a same power supply wiring, and FIG. 1B shows an example of a phase-shifting lone split wiring whose one end is connected to a power supply wiring and the other end is made free.

Referring to FIG. 1A, a loop-forming split wiring 2 is connected to a main wiring 1. The loop-forming split wiring 2 is a single wiring connected to the main wiring 1 at different positions to form a loop circuit. In the loop circuit, the main wiring 1 has a phase shift $\phi_1$ and the loop-forming split wiring 2 has a phase shift $\phi_2$ different from $\phi_1$. As a result, a phase difference of $\Delta\phi = \phi_2 - \phi_1$ is generated between signals inputted to the loop circuit at one point, transmitted through different paths in the loop circuit, and outputted to the main wiring 1 jointly at the other point. The loop-forming split wiring may be formed of a same level wiring 2 as the main wiring 1 as shown by a solid line, or of a different level wiring 2a from the main wiring 1 as shown by a broken line.

Referring to FIG. 1B, one end of a single phase-shifting split wiring 3 is connected to a main wiring 1. The other end of the phase-shifting split wiring 3 is not connected to any point and is made isolated. The phase-shifting split wiring 3 does not function as a general wiring and no d.c. current will flow therein. The phase-shifting split wiring 3 has a phase split of $\phi_3$. A signal entering the phase-shifting split wiring 3 from the main wiring 1 receives a phase shift of $\Delta\phi = 2\phi_3$ when it is reflected at the other end of the phase-shifting split wiring 3 and returned back to the main wiring 1. The phase-shifting split wiring may also be formed of a same level wiring 3 as the main wiring or of a different level wiring 3a from the main wiring 1.

In the wiring shown in FIG. 1A, consider the potential of signals entering from the left side of the main wiring 1, transmitting through the main wiring 1 and transmitting through the loop-forming split wiring 2 constituting the loop circuit, and being added together at the downstream junction point of the loop circuit.

The signal potential at the downstream junction point is given by the following equation:

$$V(junction) = V(a, t) + V(b, t) \quad \ldots (4)$$

where a represents the length of the main wiring 1 constituting the loop circuit and b represents the length of the loop-forming split wiring 2.

Assuming that this signal is a noise, a noise potential V (junction) lowers if a phase difference between V(a, t) and V(b, t) is larger than 0 and smaller than $2\pi$. The phase difference is preferably between $\pi/2$ and $3\pi/2$, and more preferably is between $3\pi/4$ and $5\pi/4$. In other words, noise amplitudes are attenuated if $$k\omega t - \beta_1 a - (\omega t - \beta_2 b) = |\beta_2 b - \beta_1 a| = \Delta\phi$$

is larger than 0 and smaller than $2\pi$. Cancellation becomes maximum when the phase difference is $\pi$. Since the phase constants $\beta_1$ and $\beta_2$ can be adjusted by changing the lengths a and b of the wiring, the phase difference $\Delta\beta$ can be set in a range of larger than 0 and smaller than $2\pi$.

The following approximation is possible at a high frequency of 250 MHz or higher. The numerator of the equation (3) can be represented by:

$$\begin{aligned}
RG - \omega^2 LC &+ \{(R^2 + \omega^2 L^2) * (G^2 + \omega^2 C^2)\}^{1/2} = \\
RG &+ \omega^2 LC[-1 + \{(R^2 + \omega^2 L^2) * (G^2 + \omega^2 C^2)/\omega^4 L^2 C^2\}^{1/2}] = \\
RG &+ \omega^2 LC[-1 + \{(R^2/\omega^2 L^2 + 1) * (G^2/\omega^2 C^2 + 1)\}^{1/2}] = \\
RG &+ \omega^2 LC[-1 + \{1 + (R^2/L^2 + G^2/G^2)/\omega^2 + R^2 C^2/\omega^4 L^2 C^2\}^{1/2}] = \\
RG &+ \omega^2 LC [-1 + 1 + (1/2) * (1/\omega^2) * (R^2/L^2 + \\
G^2/C^2 &+ R^2 G^2/\omega^2 L^2 C^2) + (1/4) * (1/2!) * (1/\omega^2)^2 * (R^2/L^2 \ldots)^2 + \ldots = \\
RG &+ LC [(1/2) * (R^2/L^2 + G^2/C^2 + R^2 G^2/\omega^2 L^2 L^2) + \\
&(-1/4) * (1/2!) * (1/\omega^2) * (R^2/L^2 + \ldots)^2 + \ldots]
\end{aligned}$$

$\omega \to \infty$:
$$RG + LC * (1/2) * (R^2/L^2 + G^2/C^2) =$$
$$(1/2LC) * (2LCRG + C^2 R^2 + L^2 G^2) = (1/2LC) * (CR + LG)^2$$

It becomes therefore that:

$$\alpha = \{(1/2LC) * (CR + LG)^2 (1/2)\}^{1/2}$$
$$= (R/2) * (C/L)^{1/2} * (G/2) * (L/C)^{1/2}$$

Similarly, it becomes that:

$$\beta = [-RG + \omega^2 LC + \{(R^2 + \omega^2 L^2) * (G^2 + \omega^2 C^2)\}^{1/2}/2]^{1/2}$$
$\omega \to \infty$:
$$[\{\omega^2 LC + (\omega^2 L^2 + \omega^2 C^2)^{1/2}\}/2]^{1/2} = (\omega^2 LC)^{1/2} = \omega (LC)^{1/2}$$

The phase constants $\alpha$ and $\beta$ change their values with L and C. The phase constant fi in particular changes its value with only L and C. By using the wiring structures shown in FIGS. 1A and 1B and designing the main wiring and split wiring, a desired phase difference can be obtained.

Figure 2A:
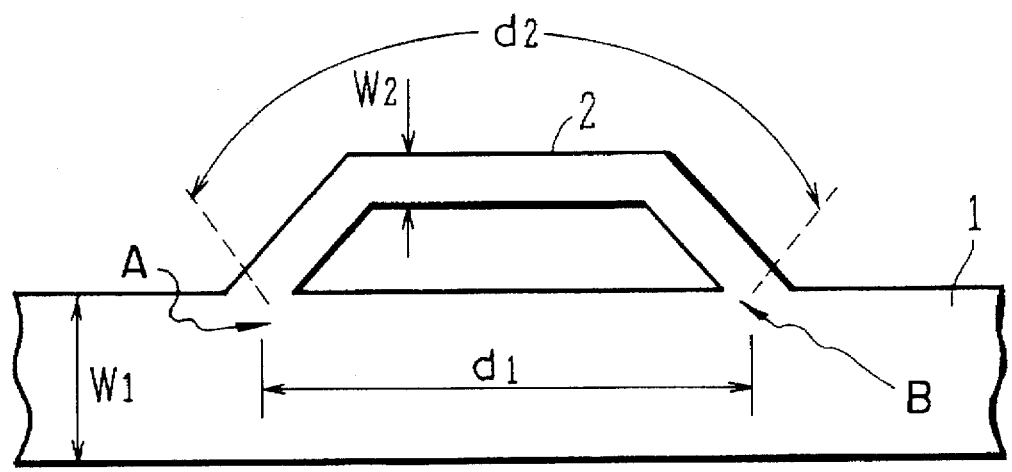
FIGS. 2A and 2B are plan views showing the structures of power supply wirings according to specific embodiments of the present invention.
Figure 2B:
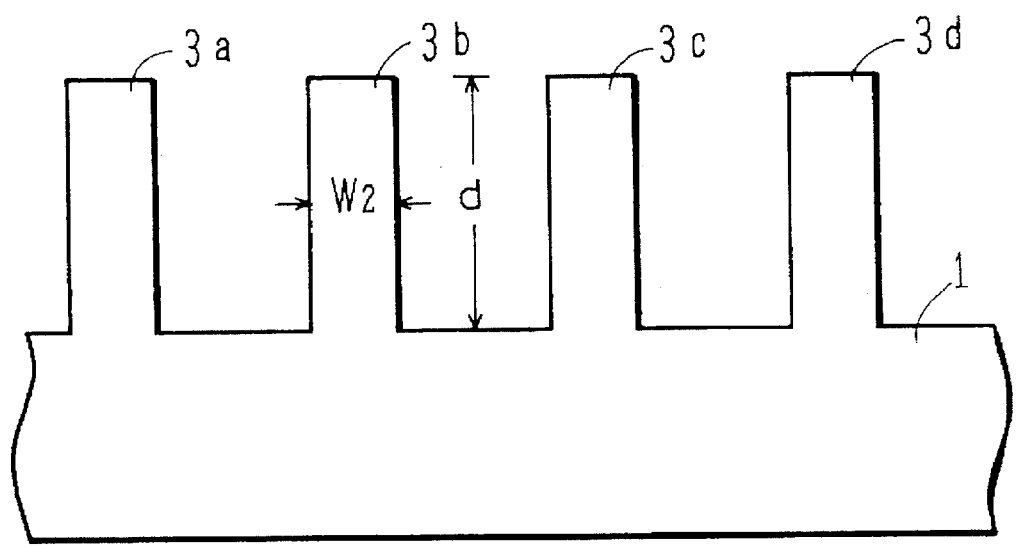

FIGS. 2A and 2B show examples of wirings having the structures shown in FIGS. 1A and 1B, in more concrete forms. FIG. 2A shows an example of the structure of a loop-forming split wiring, and FIG. 2B shows an example of the structure of a lone phase-shifting split wiring with only one end thereof connected to the main wiring.

Referring to FIG. 2A, the main wiring 1 and loop-forming split wiring 2 are formed by the same wiring layer. The width of the loop-forming split wiring 2 is set narrower than the width of the main wiring 1. The length of the loop-forming split wiring 2 is set longer than the corresponding length of the main wiring 1.

Referring to FIG. 2B, a plurality of phase-shifting split wirings 3 are branched from the main wiring 1. Each phase-shifting wiring 3 is connected at its one end to the main wiring 1, and the other end is not connected to any point and is made isolated. No circuit element is connected to the phase-shifting split wiring itself. In FIG. 2B, four phase-shifting split wirings 3a to 3d are shown. The number of these split wirings is optional.

The characteristics of the wiring structures shown in FIGS. 2A and 2B and the conventional wiring structure shown in FIG. 3B were simulated for the purpose of comparison.

In the structure shown in FIG. 2A, the width $W_1$ of the main wiring 1 was set to 10 µm, the distance between the junction points $d_1$ was set to 200 µm, the length $d_2$ of the loop-forming split wiring 2 was set to 1 mm, and the width $W_2$ thereof was set to 1 µm.

For the structure of the phase-shifting split wiring shown in FIG. 2B, a single split wiring having a length d of 1 mm and a width $W_2$ of 1 µm was used. The main wiring 1 having the same dimension as FIG. 2A was used.

For the structure of the conventional wiring shown in FIG. 3B, a wiring having a width $W_1$ of 15 µm was used.

These wirings were designed to be formed on a substrate having a surface insulating film and a total thickness of $H_1$. These wirings were designed to have a thickness of T. The thickness of the insulating film of the substrate was set to $H_2$.

L, R, and C of each wiring can be expressed by the following equations:

$$L \simeq 2 \ln\{6H_1/(0.8W + T)\} \quad [nH/cm] \quad (9)$$
$$C \simeq \{1.15(W/H_2) + 2.8 (T/H_2)^{0.222}\}\epsilon_{ox} \quad [F/m]$$
$$\epsilon_{ox} = 8.855 * 10^{-12} * 3.9 \quad [F/m]$$
$$R = (d/W) * R[] \quad [\Omega/\mu m]$$

where $H_1$ represents a thickness of the substrate (i.e. level of the wiring), W represents a width of a wiring, T represents a thickness of a wiring, $H_2$ represents a thickness of an insulating film, R[] represents a sheet resistance of a wiring, and d represents a length of a wiring.

By using the equations (9), L, R, and C of each wiring shown in FIGS. 1A and 1B and FIG. 3B were calculated.

Figure 4A:
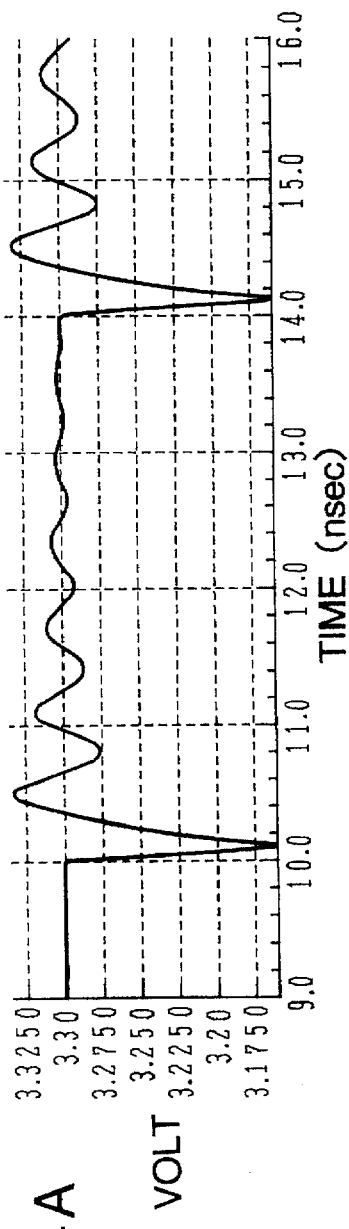
FIGS. 4A, 4B, and 4C are graphs showing the characteristics of power supply wirings according to the embodiments of the invention, and to a conventional power supply wiring.
Figure 4B:
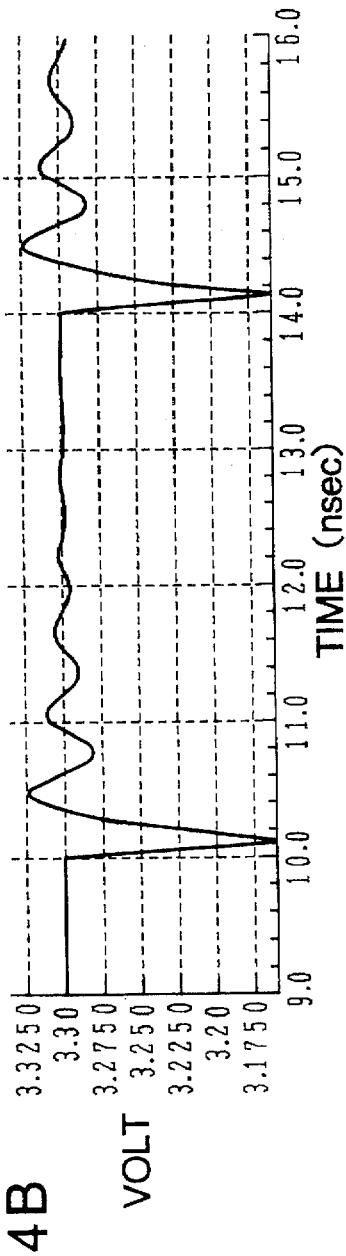
Figure 4C:
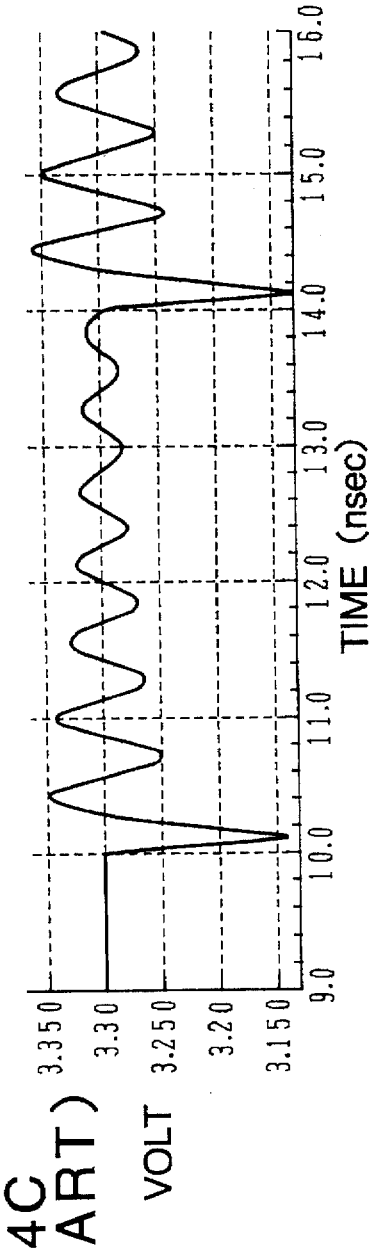

FIGS. 4A, 4B, and 4C show changes in the noise waveforms of the wirings having the structures shown in FIGS. 2A and 2B and FIG. 3B. FIG. 4A stands for the structure shown in FIG. 2A, FIG. 4B stands for the structure shown in FIG. 2B, and FIG. 4C stands for the structure shown in FIG. 3B. It is apparent that noise waveforms of the structures shown in FIGS. 2A and 2B attenuate considerably fast as compared to the waveform of the conventional wiring structure shown in FIG. 3B.

As seen from the waveforms shown in FIGS. 4A, 4B, and 4C, the noise amplitudes of the structures shown in FIGS. 2A and 2B are suppressed in 3 nsec and the noises as the whole are more effectively suppressed as compared to the conventional wiring. The effects of noise amplitude attenuation of the wirings become thus effective particularly at an operating frequency of 250 MHz or higher, more specifically between about 250 MHz and 300 MHz. The noise suppressing effect is remarkable also in a frequency range of about 300 MHz or higher.

Let us assume that a noise signal is coming from the lefthand side of FIG. 2A. The noise signal is divided at point A into two parts. The divided noise signals propagate through the main wiring 1 and the loop-forming split wiring 2 and then join at point B. At point B, the joined signal voltage can be expressed as $V(t) = V_o q \exp(-2\alpha_1 d_1) \sin(\omega t - \beta_1 d_1) + V_o(1-q) \exp(-2\alpha_2 d_2) \sin(\omega t - \beta_2 d_2)$.

Simplifying the situation by assuming that the attenuation components related with $\alpha$ are the same and that $\alpha_1 \approx \alpha_2 \approx \alpha$ and $q \approx 1-q$, we get $$V(t) = 2C\{\sin(\omega t - \beta_1 d_1) + \sin(\omega t - \beta_2 d_2)\}$$
$$= 2C\sin\{\omega t - (\beta_1 d_1 - \beta_2 d_2)/2\}\cos\{(\beta_1 d_1 - \beta_2 d_2)/2\}.$$

For assuring attenuation of the noise amplitude, the difference between phase shift $\beta_1 d_1$ and phase shift $\beta_2 d_2$ should not be $2n\pi$, where n is zero or an integer. For assuring amplitude reduction by 10% or more, we get
$-0.9 < \cos\{(\beta_1 d_1 - \beta_2 d_2)/2\} < 0.9$
Namely,
$52° \leq |\beta_1 d_1 - \beta_2 d_2| \leq 308°$
The width W and the length d of the wiring may be determined to satisfy the above-mentioned conditions.

If the attenuation effects of noise amplitude of the phase-shifting split wiring shown in FIG. 2B are defined to be (amplitude of combined wave)/(amplitude of initial wave), the effects can be given approximately by:
$\{1+\exp[-4d\alpha]+2\exp[-2d\alpha]*\cos(2d\beta)\}^{1/2}$
where d is the length, G the attenuation constant, and $\beta$ the phase constant of the phase-shifting split wiring. In order to give such effects, the value of this equation is required to be smaller than 1. That is to say, the following inequality is to be satisfied to give the effects:
$\cos(2d\beta) < -(\exp[-2d\alpha]/2)$
The wiring length d and width W are selected so as to satisfy the above condition. The condition for the loop-forming split wiring may also be derived by solving the equation of the combined wave in the manner similar to the phase-shifting split wiring.

In FIGS. 2A and 2B, the split wiring is constituted by a straight wiring or a set of straight wirings. The shape of the split wiring is not limited to such wirings, but various other shapes of wiring may be used if only a signal transmitted to the split wiring can be superposed on a signal transmitted to the main wiring at a different phase. The split wiring is used for suppressing noises on the main wiring, and current consuming circuit elements are not connected to the split wiring.

In a semiconductor integrated circuit device, power supply wirings are connected to power supply pads formed for example in a peripheral portion of a chip, and the power supply pads are connected to terminals such as leads of a lead frame by gold lead wires. These lead wires have inductance. If noises on the power supply wirings are transferred to lead wires, voltage waveforms may oscillate by the inductance of the lead wires and resistance of the pads and lead wires.

Figure 5A:
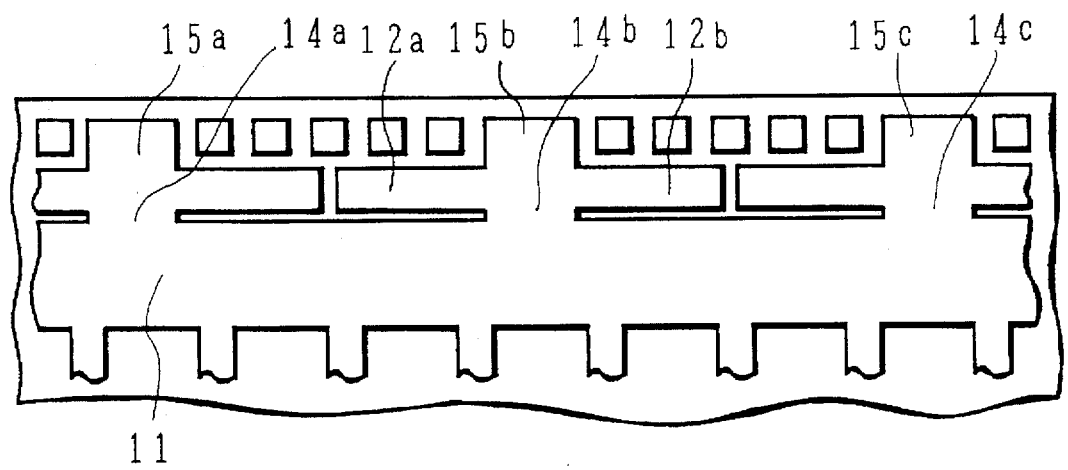
FIGS. 5A and 5B are plan views showing the structures of power supply wirings according to other embodiments of the invention.
Figure 5B:
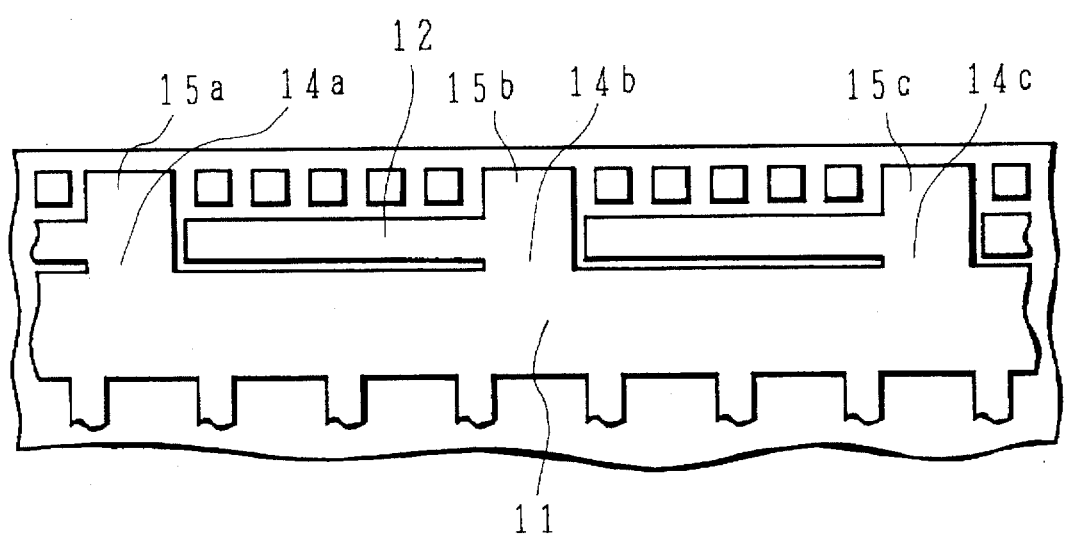

FIGS. 5A and 5B show examples of the structures which allow noises on power supply wirings to be suppressed on the pad side. In FIG. 5A, a power supply wiring 11 is disposed at the peripheral area of a chip generally parallel to bonding pads 15, and connected to power supply pads 15 via connection areas or neck portions 14 at a plurality of chip peripheral areas. Phase-shifting split wirings are connected to the connection areas 14 between the power supply wiring 11 and power supply pads 15.

For example, in the case of the power supply pad 15b, two phase-shifting split wirings 12a and 12b are branched from the connection area 14b between the power supply wiring 11 and power supply pad 15b, on the both sides thereof.

The widths and lengths of the phase-shifting split wirings 12a and 12b can be determined in accordance with the above-described analysis so as to reduce noises. The determined values may be modified after testing the noises on a power supply wiring having a sample split wiring.

In FIG. 5A, phase-shifting split wirings are formed on both the sides of the connection area connected to the power supply pad. Only one side of the connection area may be connected to a phase-shifting split wiring.

FIG. 5B shows phase-shifting wirings connected to only one side of connection areas connected to power supply pads. A phase-shifting split wiring 12 is connected to the left side of the connection area 14b between the power supply line 11 and power supply pad 15b. The cross sectional area and length of each phase-shifting split wiring can be determined in accordance with the above-described analysis and by checking the test result of a sample phase-shifting split wiring.

FIGS. 5A and 5B show examples of the structures of phase-shifting split wirings whose one ends are connected to the connection area and the other ends are isolated. A loop-forming split wiring may be formed near the power supply pad.

Figure 6A:
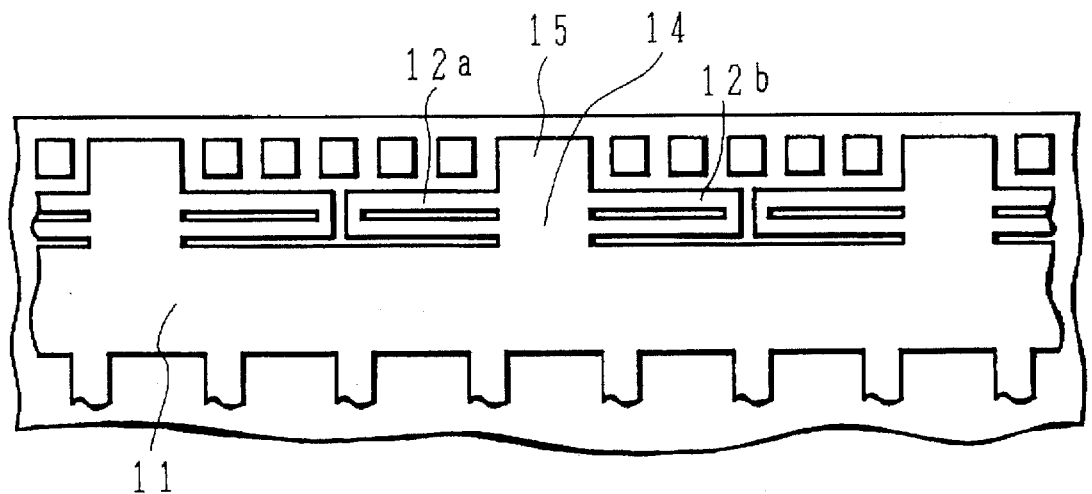
FIGS. 6A and 6B are plan views showing the structures of power supply wirings according to other embodiments of the invention.
Figure 6B:
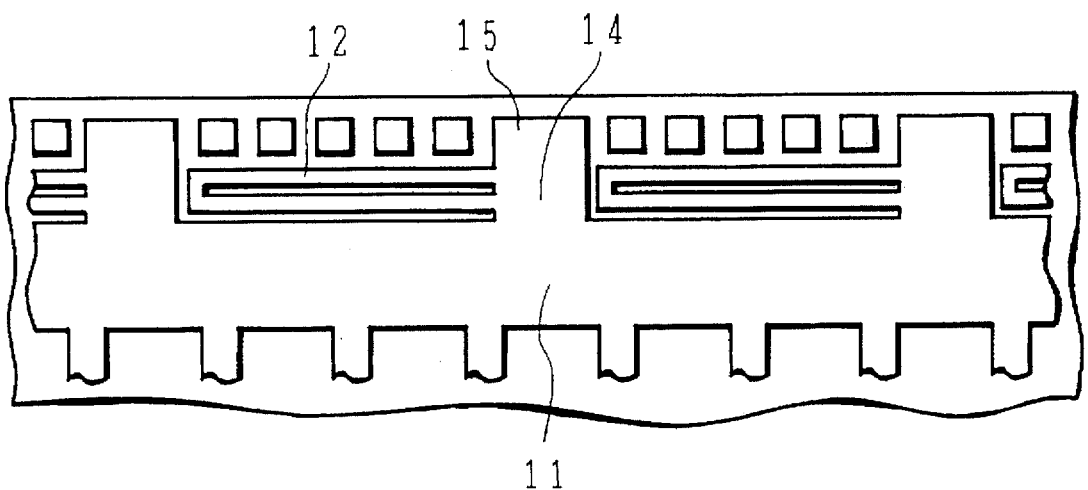

FIGS. 6A and 6B show examples of the structures of power supply wirings having loop-forming split wirings near power supply pads.

In FIG. 6A, loop-forming split wirings 12a and 12b are connected to both the sides of connection areas 14 at the chip peripheral areas between the power supply wiring 11 and power supply pads 15. The cross sectional area and length of each loop-forming split wiring 12a, 12b can be determined in accordance with the above-described analysis and by checking the test result of a sample phase-shifting split wiring.

In FIG. 6A, two loop-forming split wirings are formed on both the sides of the connection area. The number of loop-forming split wirings is not limited to two. In FIG. 6B, a loop-forming split wiring 12 is connected to one side of a connection area 14 between the power supply wiring 11 and power supply pad 15.

It is obvious to those skilled in the art that split wirings for suppressing noises on a power supply wiring shown in FIGS. 5A and 5B and FIGS. 6A and 6B can be selectively used by considering the pitch between power supply pads or the like.

Presence of split wirings connected to a power supply wiring for suppressing noises on a power supply wiring increases a chip area necessary for patterning a power supply wiring. If split wirings connected to a plurality of power supply wirings are disposed while being juxtaposed with each other, the chip area necessary for forming split wirings can be effectively used.

Figure 7A:
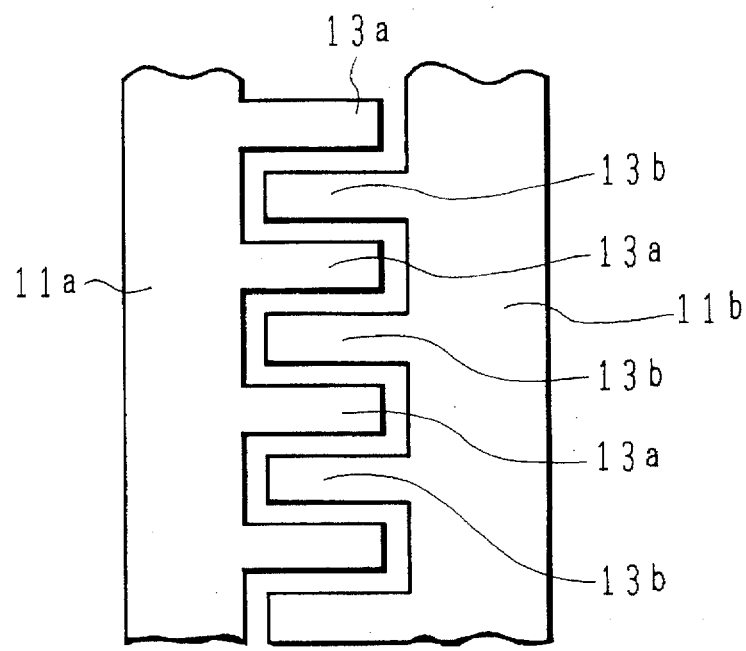
FIGS. 7A and 7B are plan views showing the structures of power supply wirings according to other embodiments of the invention.
Figure 7B:
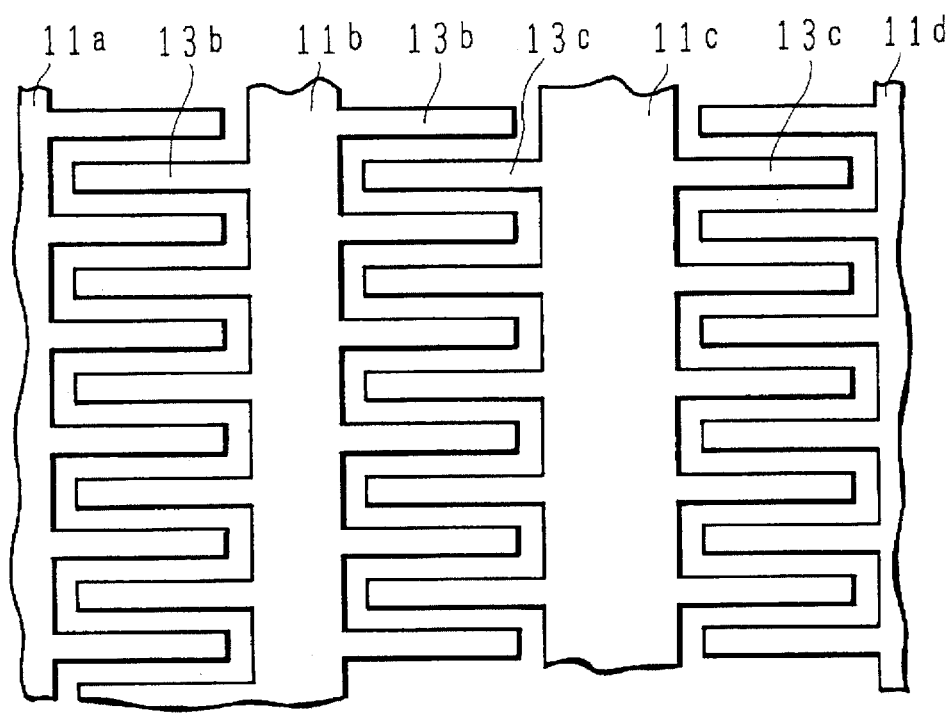

FIGS. 7A and 7B show examples of the structures of phase-shifting split wirings whose one ends are connected to power supply wirings and other ends are isolated, the phase-shifting wirings being disposed in an inter-digital form.

In FIG. 7A, two power supply wirings 11a and 11b are disposed in parallel. In the area where a pair of power supply wirings faces each other, a plurality of split wirings 13a are formed extending from one power supply wiring 11a, and another plurality of split wirings 13b are formed extending from the other power supply wiring 11b. The extending split wirings 13a and 13b are alternately disposed to constitute an inter-digital form.

In the structure shown in FIG. 7A, two power supply wirings face each other and split wirings extend from one wiring to the other wiring and from the other to the one.

Three or more power supply wirings may be disposed in parallel, and the similar structure to the above may be used.

In FIG. 7B, power supply wirings 11a, 11b, 11c, and 11d are disposed in parallel. For example, the two power supply wirings 11b and 11c have split wirings 13b and 13c extending from both sides of the power supply wirings 11b and 11c. These split wirings are alternately disposed and meshed with one another extending from the power supply wirings 11b and 11c on opposite sides thereof to constitute an inter-digital form.

Split wirings 13b extend from opposite sides of the power supply wiring 11b at right and left positions thereof displaced from one another. On the other hand, split wirings 13c extend from opposite sides of the power supply wiring 11c at the same right and left positions thereof.

The connections of split wirings can be modified in various ways as described above. Use of a plurality of split wirings allows noises on power supply wirings to be suppressed more effectively.

Figure 8A:
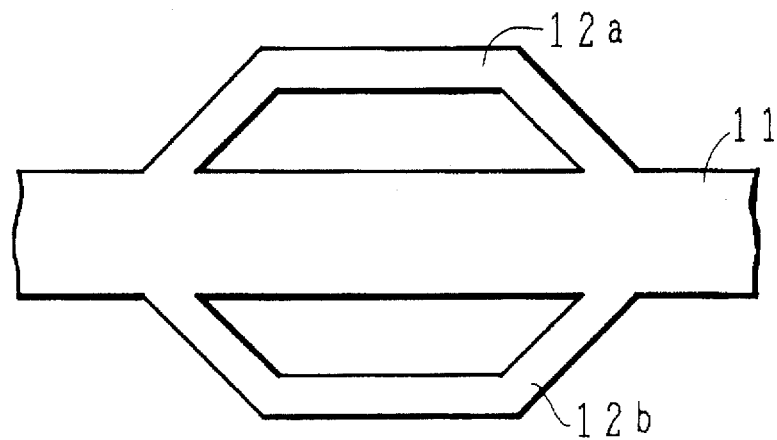
FIGS. 8A and 8B are plan views showing the structures of power supply wirings according to other embodiments of the invention.
Figure 8B:
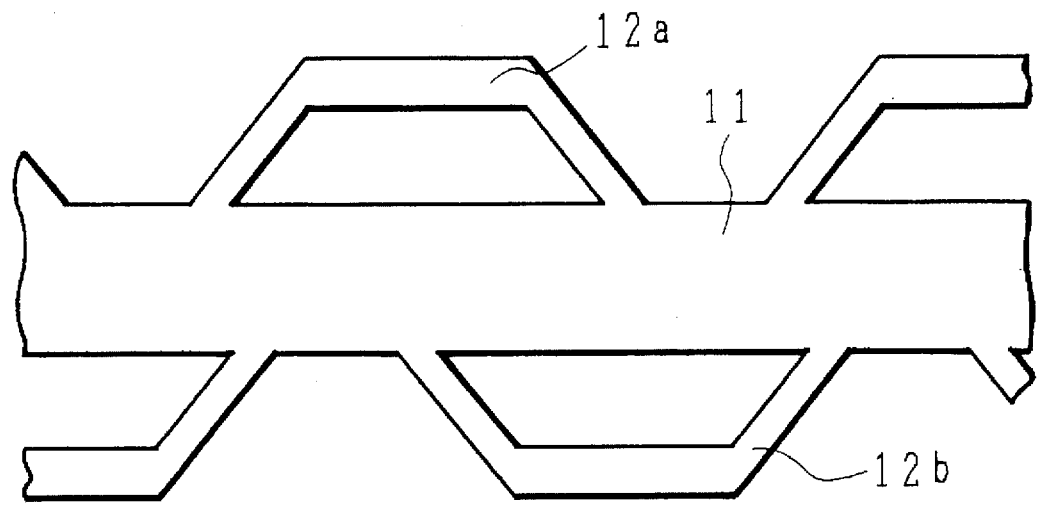

FIGS. 8A and 8B show examples of the structures of power supply wirings each having a plurality of loop-forming split wirings. In the structure shown in FIG. 8A, loop-forming split wirings 12a and 12b having the same shape are symmetrically connected to both the sides of a power supply wiring 11.

In FIG. 8B, loop-forming split wirings 12a and 12b are connected to both the sides of a power supply wiring 11 in a staggered manner.

The noise-reducing wiring structure as described above can be formed at such places where noise occurrence disturbs the circuit function.

Figure 9:
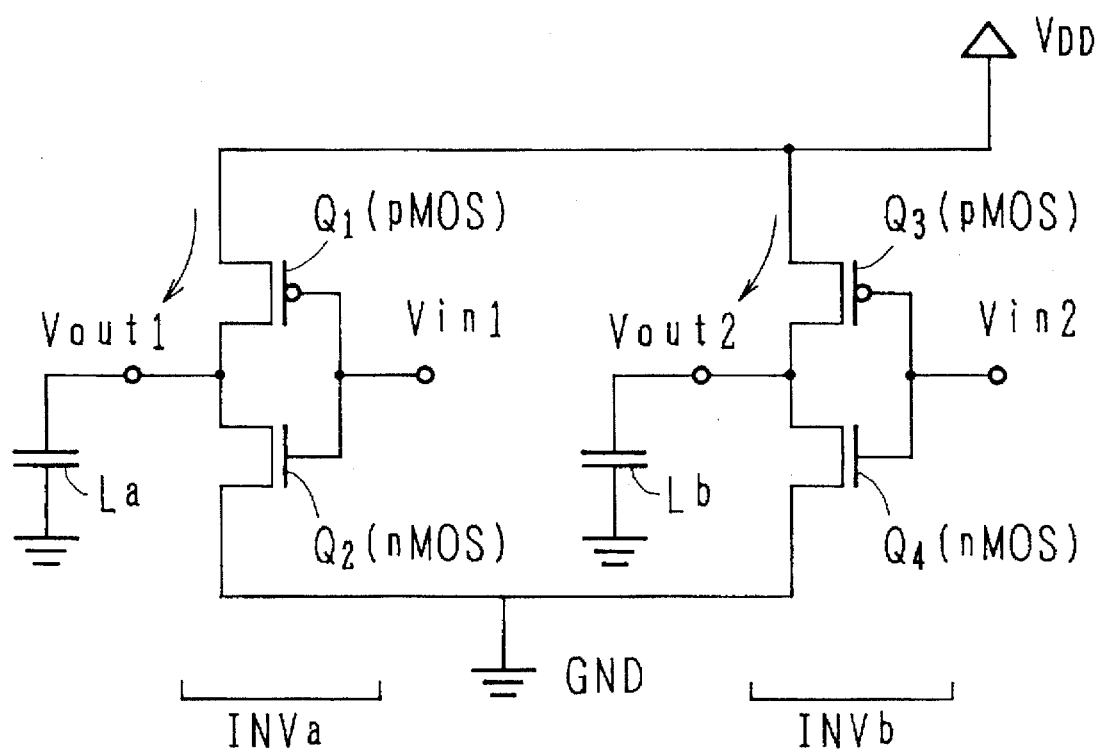
FIG. 9 is a circuit diagram of a MOS inverter circuit.

FIG. 9 shows a circuit diagram of a CMOS circuit. In FIG. 9, two inverters INVa and INVb are connected in parallel between the source voltage line $V_{DD}$ and the ground potential line GND. A first inverter INVa is formed of a pMOS transistor $Q_1$ and an nMOS transistor $Q_2$ connected in series between the source voltage line $V_{DD}$ and the ground line GND. The gates of the transistors $Q_1$ and $Q_2$ are commonly connected to an input terminal Vin1 and the output terminal Vout is connected to a load La. Another inverter INVb is similarly formed of a pMOS transistor $Q_3$ and an nMOS transistor $Q_4$ connected in series between the source voltage line $V_{DD}$ and the ground line GND. The gates of the transistors $Q_3$ and $Q_4$ are commonly connected to an input terminal Vin2, and the output terminal Vout is connected to a toad Lb.

When the input signal Vin1 is changed from the high "1" state to a low "0" state, the pMOS transistor $Q_1$ will be turned on, to allow a current to flow therethrough to the load La. At this point, the current begining to flow from $V_{DD}$ to the load La will cause a noise in wiring. This noise will be transmitted and give influence to the neighboring inverter INVb. When the potential of the voltage source line is lowered by the current flowing into the load La, the source voltage for the inverter INVb is lowered. If the input signal Vin2 changes from a "1" state to "0" state at this moment, the lowering of the source voltage will reduce the effect of the input signal change. That is to say, the change in the input signal Vin2 will give only a reduced effect to the transistor $Q_3$. Then, the action of the pMOS transistor $Q_3$ is slowed down. Therefore, the rising speed of the inverter INVb is lowered. Similar phenomenon will occur when the inverter INVb is first driven and then another inverter INVa is then driven.

If the input signal changes from a low level ("0") to a high level ("1"), the nMOS transistor $Q_2$ or $Q_4$ is turned on to discharge the charge at the load La or Lb. Such a current may raise the potential of the ground line GND. If the potential of the ground line GND is raised, the action of the nMOS transistor $Q_2$ or $Q_4$ is slowed down.

For preventing the reduction of the operation speed of the inverter, it is preferable to avoid the effect of the noise in such CMOS circuit.

Figure 10A:
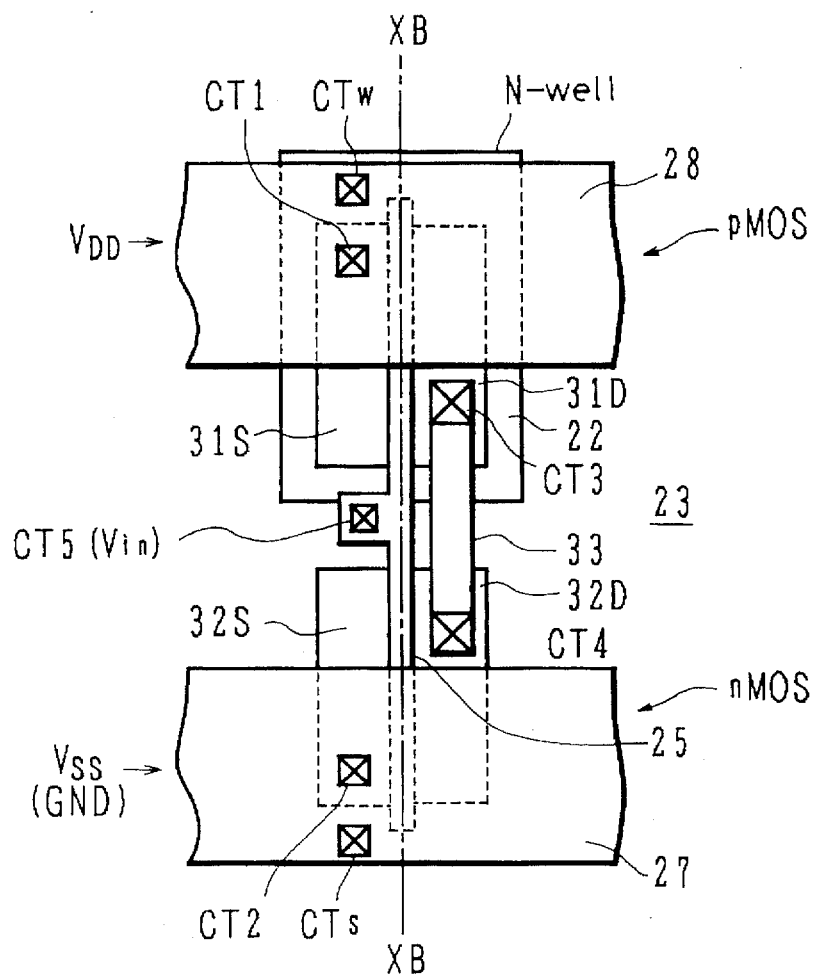
FIGS. 10A and 10B are a plan view and a cross-section of a wiring structure in a MOS inverter.
Figure 10B:
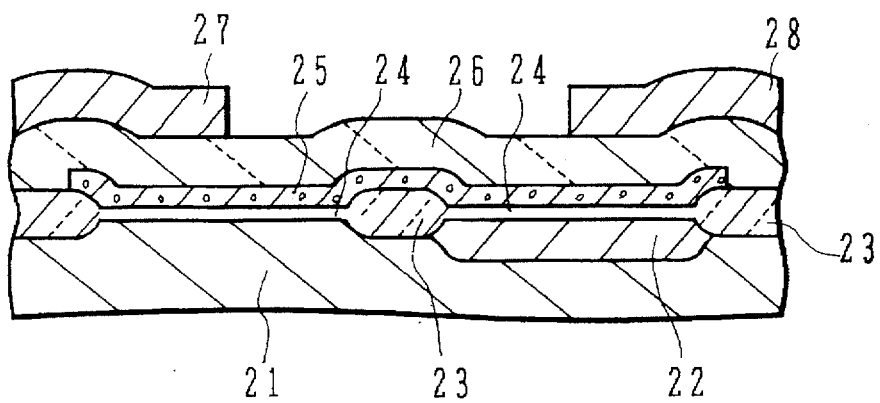

FIGS. 10A and 10B show an example of a basic structure of a CMOS inverter. FIG. 10A shows a plan view and FIG. 10B shows a cross section. In FIG. 10A, a pMOS transistor is formed in the upper part and an nMOS transistor is formed in the lower part. A p-type source region 31S and a p-type drain region 31D are formed in an n-type well 22. A gate electrode 25 is disposed between the source region 31S and the drain region 31D.

An n-type source region 32S and an n-type drain region 32D are formed in a p-type substrate. The gate electrode 25 extends vertically between the source region 32S and 32D. A local interconnect 33 connects the p-type drain region 31D and the n-type drain region 32D. A source voltage ($V_{DD}$) line 28 extends horizontally in the upper part of the figure and a ground line 27 extends horizontally in a lower part of the figure. A contact CT1 connects the voltage source line 28 with the source region 31S of the pMOS transistor and a contact CT2 connects the ground line $V_{SS}$ with the source region 32S of the nMOS transistor Contact CTw represent the connection between the source voltage line 28 and the n-type well 22, and a contact CTs represent the connection between the ground line 27 with the substrate.

FIG. 10B shows a cross section along line XB—XB in FIG. 10A. In a p-type substrate 21, an n-type well 22 is formed. A field oxide film 23 and a gate oxide film 24 are formed in the surface of the substrate 21. A poly-crystalline silicon gate electrode 25 is formed on the gate oxide film 24. An inter-layer insulating layer 26 such as $SiO_2$ 26 covers the gate electrode 25. On the inter-layer insulating film 26, a source voltage line 28 and a ground line 27 are formed. If a current suddenly begins to flow in the source voltage line 28 or a ground line 27, a noise may be generated and give influence on the other circuit elements.

Figure 11:
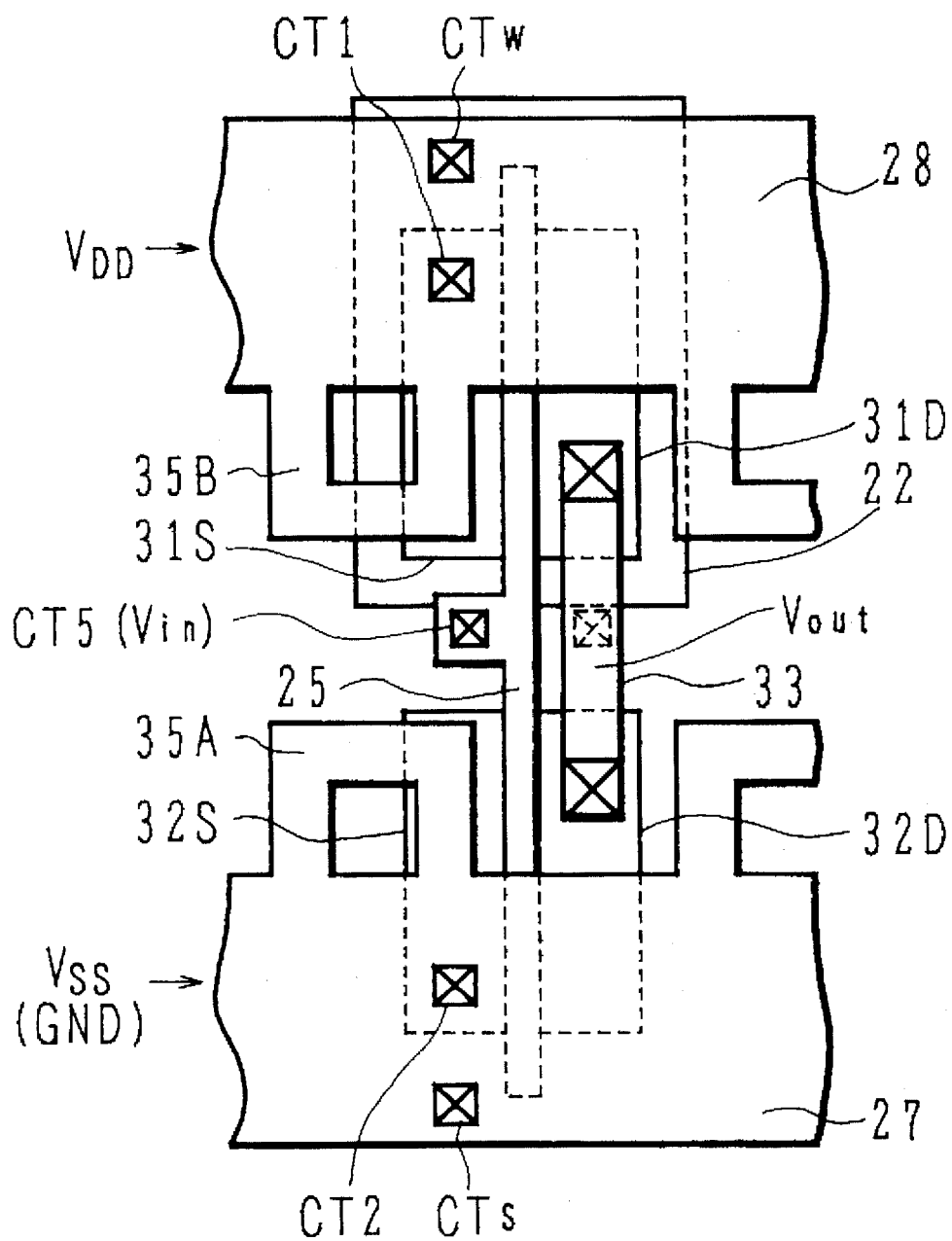
FIGS. 11, 12, 13, 14, 15 and 16 are plan views of wiring structures in a MOS inverter.

FIG. 11 shows a wiring structure capable of reducing the effect of noise. Compared to the basic structure shown in FIG. 10, loop-forming split wirings 35A are connected to the ground wiring 27, and loop-forming split wirings 35B are connected to the voltage source wiring 28. These loop-forming wirings 35 are formed of a metal layer at the same level as the power supply wirings 27 and 28.

Figure 12:
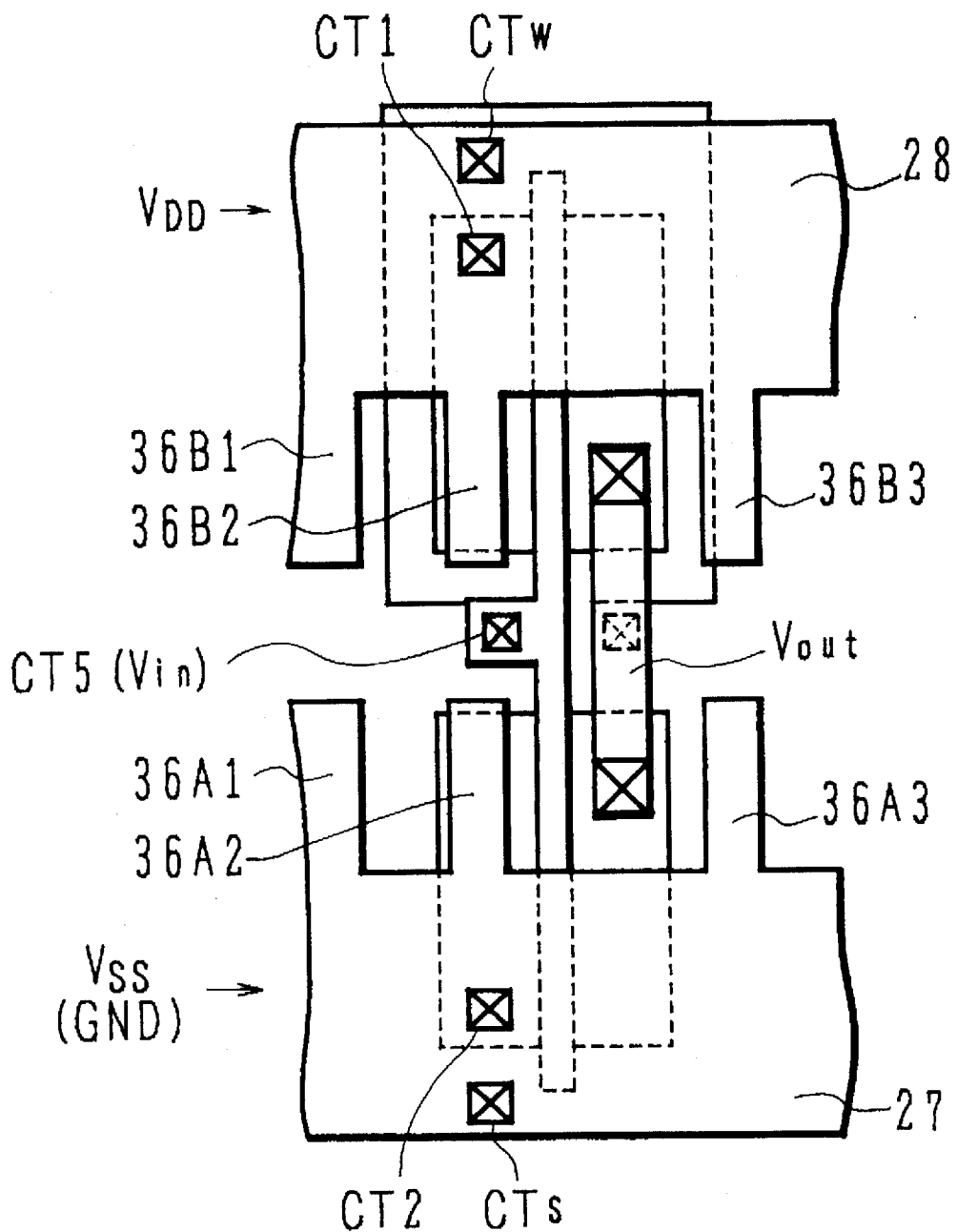

FIG. 12 shows another structure capable of reducing the effect of noise. Lone split wirings 36A1, 36A2, 36A3, . . . are connected to, or project from the ground wiring 27, and lone split wiring 36B1, 36B2, 36B3, . . . are connected to, or project from the voltage source wiring 28.

The power supply wirings may be formed in multiple layers. Noise-reducing split wirings may be formed in every wiring layer in such a case.

Figure 13:
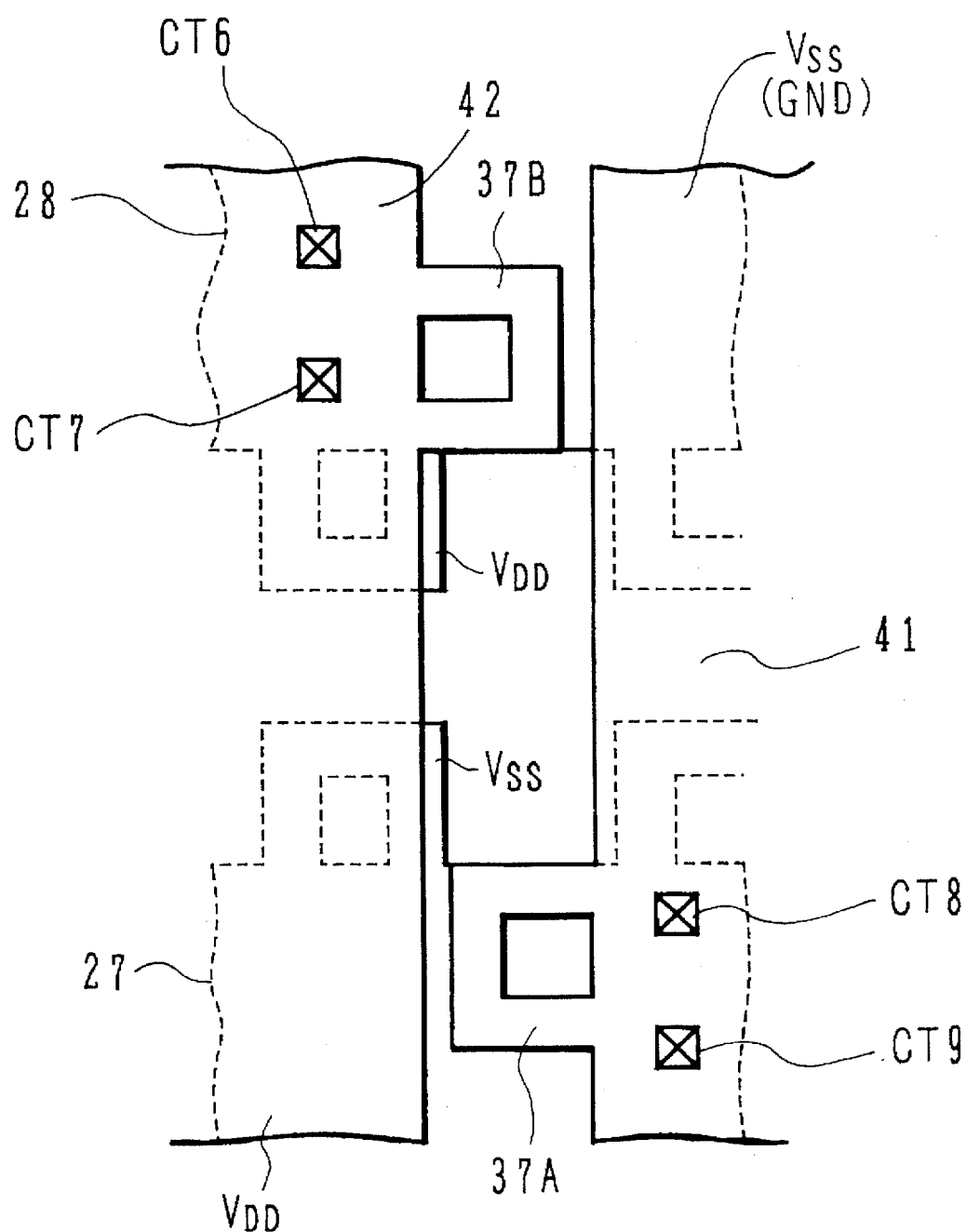

FIG. 13 shows an example of multi-layer power supply wiring. In this figure, in addition to the wiring structure as shown in FIG. 11, another power source wiring layer is formed thereabove. A ground wiring 41 extends vertically in the figure, and is connected to the lower level ground wiring 27 through contacts CT8 and CT9. A voltage source wiring 42 also extends vertically and is connected to the lower level voltage source wiring 28 through contacts CT6 and CT7. Loop-forming split wirings 37A and 37B are connected to the ground wiring 41 and voltage source wiring 42. In this way, phase-shifting loop-forming split wirings are formed in both the lower and the upper power supply wirings.

Figure 14:
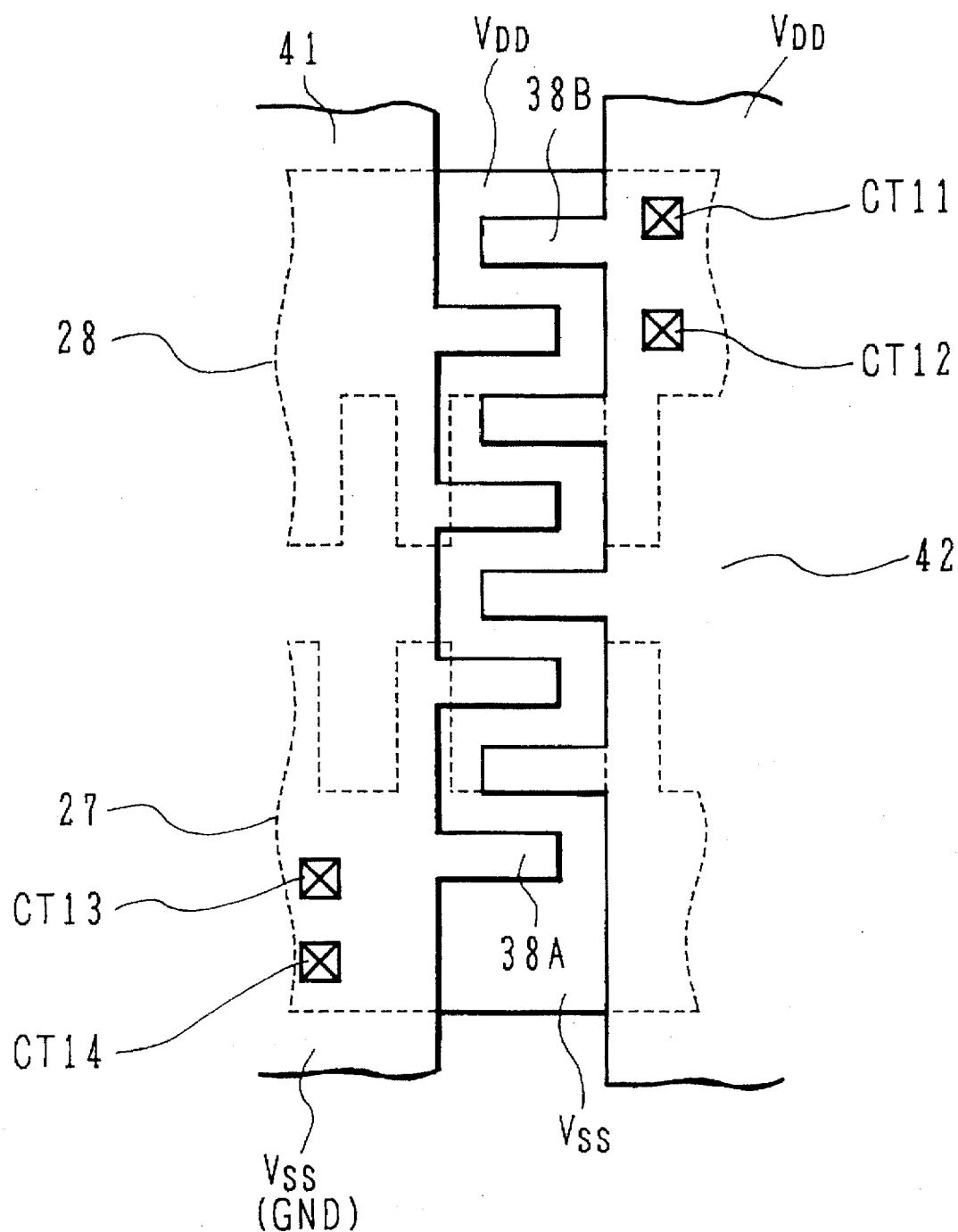

FIG. 14 shows another example of a multi-layer power supply wiring. In this figure, in addition to the power supply wiring as shown in FIG. 12, an upper level power supply wirings are formed thereabove. An upper level ground wiring 41 extends vertically and is connected to the lower level ground wiring 27 through contacts CT13 and CT14. An upper level voltage supply wiring 42 extends vertically and is connected to the lower level voltage source wiring 28 through contacts CT11 and CT12. Lone split wirings 38A and 38B are connected to the upper level ground wiring 41 and the upper level voltage source wiring 42, respectively.

In the above structures, the power supply wiring and the phase-shifting split wiring are formed in the same level. The phase-shifting split wiring can be formed in a different level from the power supply wiring.

Figure 15:
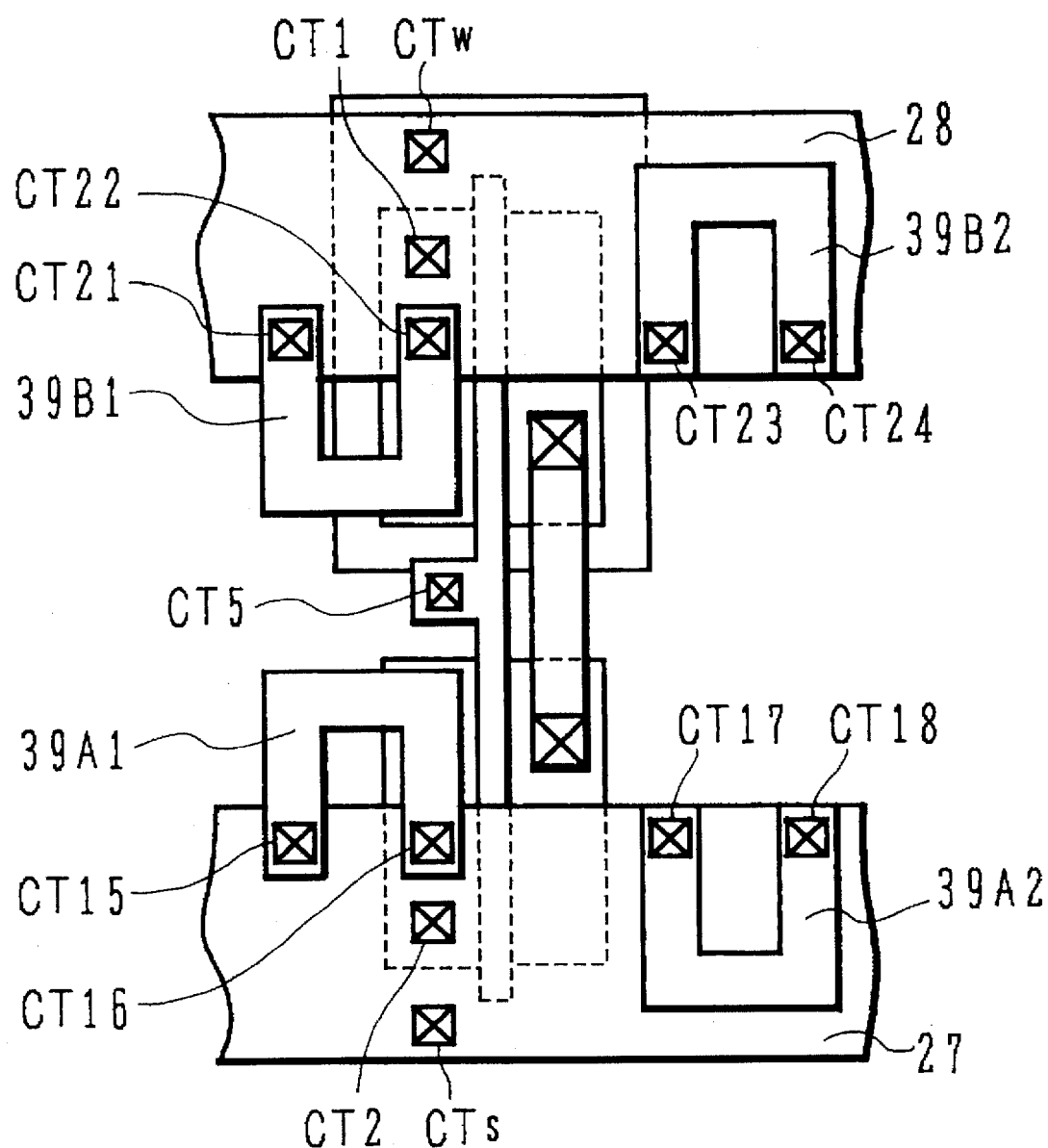

FIG. 15 shows a structure of power supply wirings in which different level phase-shifting split wirings are connected thereto. In this figure, the power supply wirings 27 and 28 are covered by an inter-layer insulating film and another wiring layer including phase-shifting split wirings is formed thereon. Loop-forming split wirings 39A1 and 39A2 are connected to the lower level ground wiring 27 through contacts CT15–CT18. Further, the loop-forming split wiring 39A1 projects upward while the other loop-forming split wiring 39A2 projects downward. Also, loop-forming split wiring 39B1 and 39B2 are connected to the lower level voltage source wiring 28 through contacts CT21–CT24.

Figure 16:
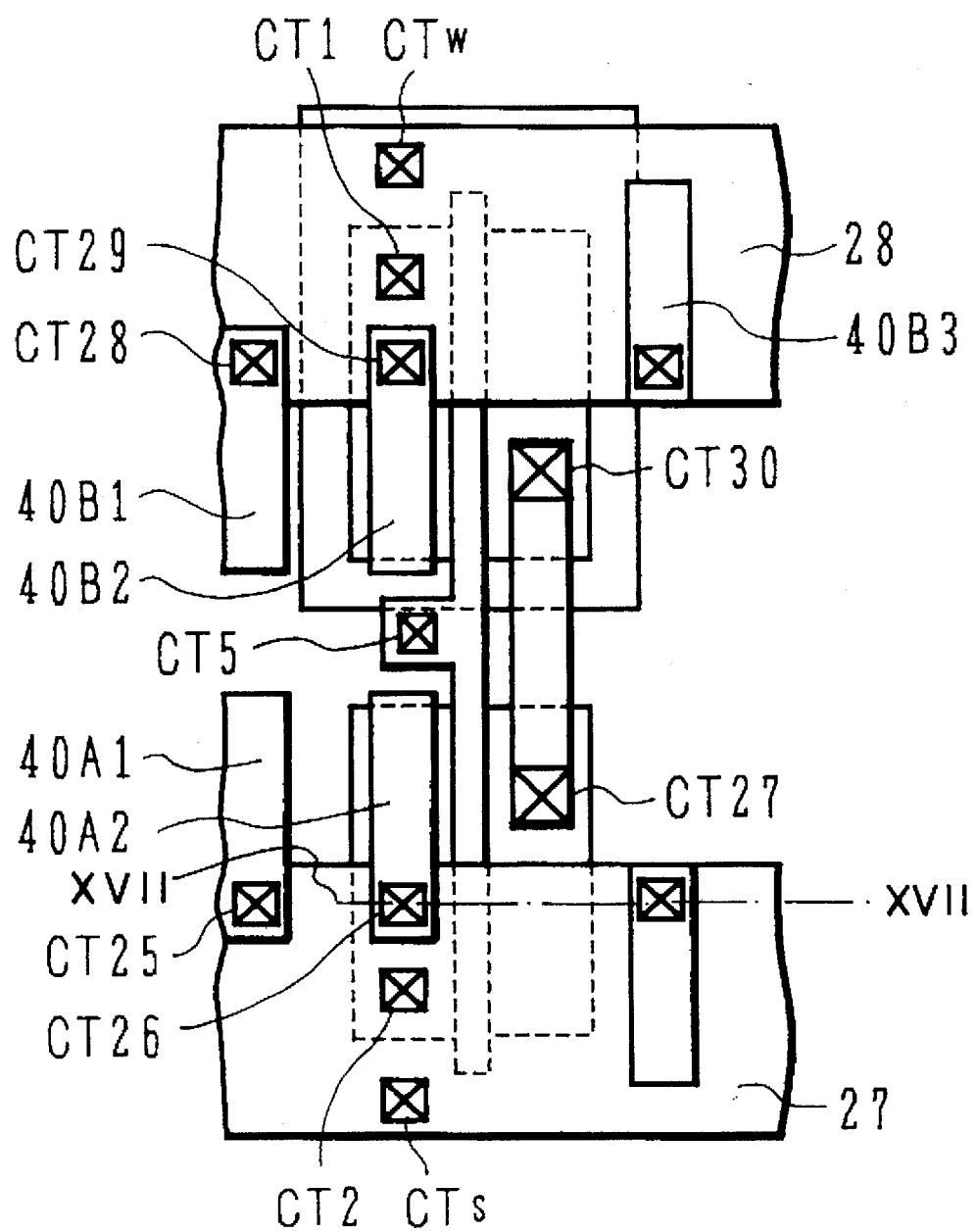

FIG. 16 shows another structure of phase-shifting split wiring in different layer. In this figure, lone split wirings 40A1, 40A2, 40A3, . . . are connected to the lower level ground wiring 27 through contacts CT25, CT26, CT27, . . . .. Lone split wirings 40B1, 40B2, 40B3, . . . are connected to the lower level voltage source wiring 28 through contacts CT28, CT29, CT30, . . . .. In FIGS. 15 and 18, phase-shifting split wirings project upward and downward from the contacts.

Figure 17:
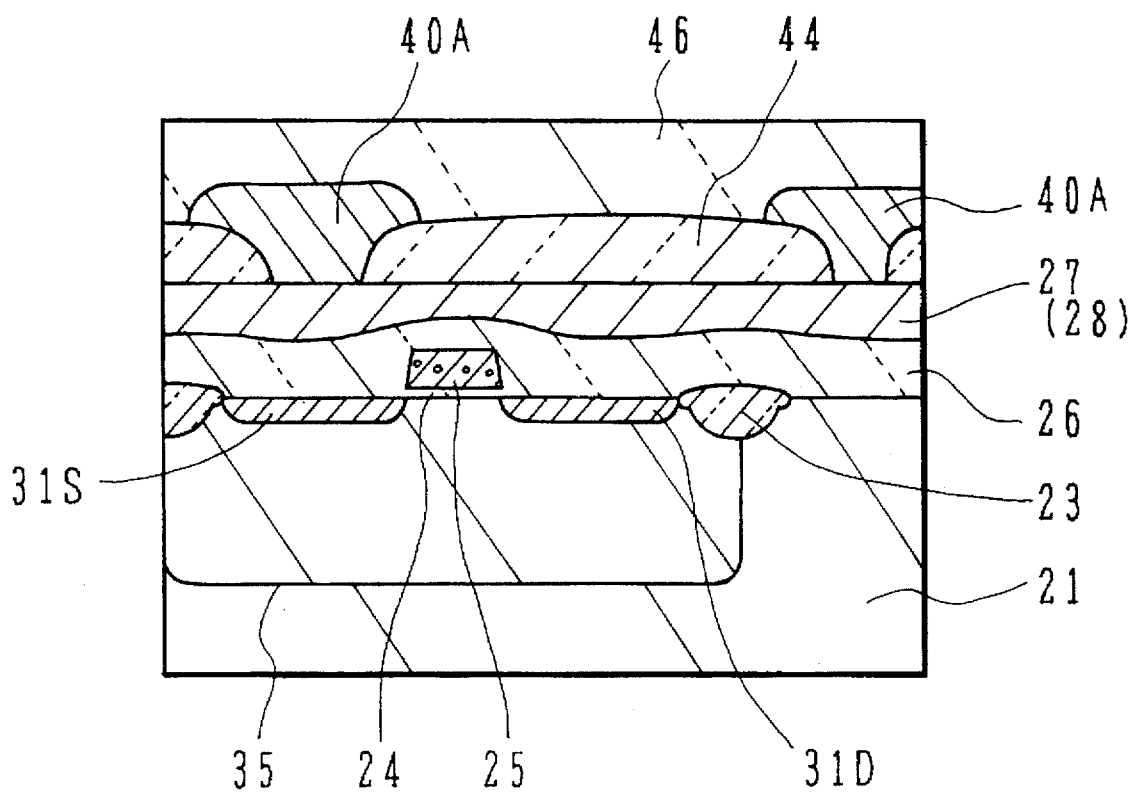
FIG. 17 is a cross section of a wiring structure as shown in FIG. 16.

FIG. 17 shows a cross section taken along a line XVII—XVII in FIG. 16. In this figure, a p-type well 85 is formed in a p-type substrate 21. An n-type source 31S and an n-type drain 31D are formed in the p-type well 35. A polycrystalline silicon gate electrode 25 is formed above the channel between the source region 31S and the drain region 31D through a gate oxide film 24. An inter-layer insulating oxide 26 covers the transistor structure. A lower level power supply wiring 27 (28) extends on the inter-layer insulating film 26. Another inter-layer insulating film 44 is formed to cover the lower level power supply wiring 27 (28). An upper level power supply wiring 40A is formed on the inter-layer insulating film 44 and is connected to the lower layer power supply wiring 27 (28) through contact holes in the inter-layer insulating film 44. Another insulating film 46 covers the upper level power supply wiring 40A.

In such multi-layer noise-reducing structure as shown in FIGS. 15–17, the material of the power supply wiring and the phase-shifting split wiring may be differentiated. In such a case, the resistivity of the wiring material can be employed as a paramater for determining the phase constant.

The power supply wirings can also be formed in three layers or more. Phase-shifting split wirings may be connected to the power supply wiring at any level at any place where there is a space for forming such phase-shifting split wiring.

In the above-described embodiments, wirings such as power supply wirings are made of Al, Al alloy, refractory metal such as tungsten, cobalt, titanium, molybdenum, tantalum, or refractory metal silicide, and formed on an insulating film such as silicon oxide above the surface of a semiconductor substrate such as silicon. Patterning of wirings can be performed by using known photolithography.

The present invention has been described in connection with the preferred embodiments. The invention is not limited only to the above embodiments. It is apparent to those skilled in the art that various modifications, substitutions, combinations and the like can be made without departing from the scope of the appended claims.

We claim:

1. A CMOS IC device comprising:

a semiconductor substrate;

a power supply pad formed on said semiconductor substrate;

circuit elements including CMOS elements formed on said semiconductor substrate;

power supply wirings for interconnecting at least one of said circuit elements and said power supply pad; and phase-shifting split wirings, each phase shifting wiring of said phase-shifting split wirings being connected solely to a corresponding power supply wiring of said power supply wirings and having a width which is different from a width of said corresponding power supply wiring at a position of connection between said each phase shifting split wiring and said corresponding power supply wiring, for producing a noise phase difference between noises on said power supply wirings and on said phase-shifting split wirings.

2. A CMOS IC device according to claim 1, wherein said each phase-shifting split wiring and said corresponding power supply wiring form a loop, and a first phase shift of a signal on that part of said power supply wirings which forms said loop is different from a second phase shift of a signal on said phase-shifting split wirings, and a difference between the first phase shift and the second phase shift is a value other than 2nπ, where n is an integer.

3. A CMOS IC device according to claim 2, wherein, in said loop, the power supply wiring has a length $d_1$ and a phase constant $\beta_1$, the phase-shifting split wiring has a length $d_2$ and a phase constant $\beta_2$, and a difference between phase shift $\beta_1 d_1$ and phase shift $\beta_2 d_2$ is a value other than 2nπ, where n is an integer.

4. A CMOS IC device according to claim 3, wherein the difference between the phase shifts is between 52 degrees and 308 degrees.

5. A CMOS IC device according to claim 1, wherein said each phase-shifting split wiring has one end connected to said corresponding power supply wiring and the other end being terminated, and a phase shift of a signal transmitted from said one end, reflected from said other end, and returned back to said one end takes a finite value other than a value of 2nπ, where n is an integer.

6. A CMOS IC device according to claim 5, wherein said phase-shifting spit wiring has an attenuation constant α, a phase constant β and a length d, which satisfy cos (2dβ)<−exp (−2dα)/2.

7. A CMOS IC device according to claim 1, wherein two of said power supply wirings are disposed facing each other, and said each phase-shifting split wirings each has a tooth shape meshing with one another to form an inter-digital configuration.

8. A CMOS IC device according to claim 1, wherein said each phase-shifting split wiring is made of a conductive member having a cross sectional area smaller than said corresponding power supply wiring.

9. A CMOS IC device according to claim 1, wherein said power supply pad is located at a peripheral region of said semiconductor substrate, and said phase-shifting split wiring are located adjacent to said power supply pad in said peripheral area.

10. A CMOS IC device according to claim 9, wherein there are provided a plurality of said power supply pads, said power supply wirings including a common portion running across groups of said plurality power supply pads, and neck portions connecting said common portion and said power supply pads, and at least one of said phase-shifting split wirings are connected to each of said neck portions.

11. A CMOS IC device according to claim 10, wherein said at least one of said phase-shifting split wirings has an elongated shape parallel to said common portion.

12. A CMOS IC device according to claim 10, wherein each of said phase-shifting split wirings has one end connected to an associated neck portion of the power supply wiring and the other end terminated.

13. A CMOS IC device according to claim 10, wherein each of said phase-shifting wirings has both ends connected to different points of an associated neck portion of the power supply wirings.

14. A CMOS IC device according to claim 10, wherein each of said phase-shifting split wirings has a plurality of split wirings branching from both sides of the associated neck portion of said power supply wiring.

15. A CMOS IC device according to claim 1, wherein said phase-shifting split wirings have a first level which is different from a second level of said power supply wirings.

16. A CMOS IC device according to claim 1, wherein said IC device is configured to operate at a frequency of about 250 MHz or higher.

17. A CMOS IC device comprising:

a semiconductor substrate;

a power supply pad formed on said semiconductor substrate;

circuit elements including CMOS elements formed on said semiconductor substrate;

power supply wirings for interconnecting one of said circuit elements and said power supply pad; and phase-shifting split wirings connected solely to said power supply wirings, for producing a noise phase difference between noises on said power supply wirings and on said phase-shifting split wirings, wherein said phase-shifting split wirings have a plurality of split wirings branching from both sides of said power supply wiring, at least some of said split wirings and said power supply wirings form loops, and a first phase shift of a signal on said power supply wirings at each of said loops is different from a second phase shift of a signal on said split wirings at each of said loops.

18. A CMOS IC device comprising:

a semiconductor substrate;

a power supply pad formed on said semiconductor substrate;

circuit elements including CMOS elements formed on said semiconductor substrate;

power supply wirings for interconnecting one of said circuit elements and said power supply pad; and phase-shifting split wirings connected solely to said power supply wirings, for producing a noise phase difference between noises on said power supply wirings and on said phase-shifting split wirings, wherein said phase-shifting split wirings have a plurality of split wirings branching from both sides of said power supply wiring, at least some of said split wirings have one ends connected to said power supply wiring and the other ends thereof being terminated, and a phase shift of a signal transmitted from said one end, reflected from said other end, and returned back to said one end of each of said split wirings takes a finite value other than a value of $2n\pi$, where n is an integer.

* * * * *